US008642127B2

(12) United States Patent
Morozumi et al.

(10) Patent No.: US 8,642,127 B2
(45) Date of Patent: Feb. 4, 2014

(54) METHOD OF FORMING TITANIUM NITRIDE FILM

(75) Inventors: Yuichiro Morozumi, Nirasaki (JP);
Shingo Hishiya, Nirasaki (JP);
Katsushige Harada, Nirasaki (JP)

(73) Assignee: Tokyo Electron Limited (JP)

( * ) Notice: Subject to any disclaimer, the term of this patent is extended or adjusted under 35 U.S.C. 154(b) by 28 days.

(21) Appl. No.: 13/404,547

(22) Filed: Feb. 24, 2012

(65) Prior Publication Data
US 2012/0219710 A1  Aug. 30, 2012

(30) Foreign Application Priority Data

Feb. 28, 2011  (JP) ................................ 2011-041635
Jan. 16, 2012  (JP) ................................ 2012-006562

(51) Int. Cl.
*C23C 16/34* (2006.01)

(52) U.S. Cl.
USPC .............. 427/255.391; 427/255.394; 427/569

(58) Field of Classification Search
USPC ............................ 427/255.391, 255.394, 569
See application file for complete search history.

(56) References Cited

U.S. PATENT DOCUMENTS

| | | | | |
|---|---|---|---|---|
| 3,306,919 | A * | 2/1967 | Brantley et al. | 556/52 |
| 5,656,338 | A * | 8/1997 | Gordon | 427/576 |
| 6,057,229 | A * | 5/2000 | Hieber et al. | 438/630 |
| 6,090,709 | A * | 7/2000 | Kaloyeros et al. | 438/685 |
| 2001/0034097 | A1* | 10/2001 | Lim et al. | 438/253 |
| 2003/0082296 | A1* | 5/2003 | Elers et al. | 427/96 |
| 2003/0108674 | A1* | 6/2003 | Chung et al. | 427/255.394 |
| 2006/0014385 | A1* | 1/2006 | Kim et al. | 438/680 |
| 2006/0110533 | A1* | 5/2006 | Hwang et al. | 427/248.1 |
| 2007/0020923 | A1* | 1/2007 | Kraus et al. | 438/644 |
| 2009/0074983 | A1* | 3/2009 | Heys et al. | 427/569 |
| 2009/0233439 | A1* | 9/2009 | Park et al. | 438/655 |
| 2010/0078819 | A1* | 4/2010 | Shin et al. | 257/751 |
| 2010/0167528 | A1* | 7/2010 | Trivedi | 438/649 |
| 2011/0020547 | A1* | 1/2011 | Gatineau et al. | 427/255.28 |
| 2011/0135838 | A1* | 6/2011 | Lei et al. | 427/535 |
| 2012/0276721 | A1* | 11/2012 | Chung et al. | 438/483 |

FOREIGN PATENT DOCUMENTS

JP    2006-093653    4/2006

OTHER PUBLICATIONS

Ahmad, Sana, et al., "Self-assembled titanium-based hybrids with cyclopentadienyl-titanium bonding." Chem. Commun., 2011, 47, 5001-5003.*
Kirss, Rein U., et al., "Synthesis, characterization and spectroscopy of alkyl substituted edge-bridged open ruthenocenes". Inorganica Chimica Acta 357 (2004) 3181-3186.*

* cited by examiner

*Primary Examiner* — Bret Chen
(74) *Attorney, Agent, or Firm* — Cantor Colburn LLP (57) ABSTRACT

According to the method of forming a titanium nitride film, first, an inside of a reaction pipe accommodating a semiconductor wafer is heated up to 200° C. to 350° C. by using a temperature increasing heater. Then, the titanium nitride film is formed on the semiconductor wafer by supplying a film forming gas including a titanium raw material into the reaction pipe. Methylcyclopentadienyl tris(dimethylamino)titanium that does not include a chlorine atom and includes titanium is used as the titanium raw material.

7 Claims, 4 Drawing Sheets

METHOD OF FORMING TITANIUM NITRIDE FILM

CROSS-REFERENCE TO RELATED PATENT APPLICATIONS

This application claims the benefits of Japanese Patent Application No. 2011-041635, filed on Feb. 28, 2011 and Japanese Patent Application No. 2012-006562, filed on Jan. 16, 2012 in the Japan Patent Office, the disclosures of which are incorporated herein in their entirety by reference.

BACKGROUND OF THE INVENTION

1. Field of the Invention

The present invention relates to a method of forming a titanium nitride film, an apparatus for forming a titanium nitride film, and a program.

2. Description of the Related Art

In manufacturing of a semiconductor device, a titanium nitride film (TiN film) is used as a material for a barrier film, electrode, or the like. Such a titanium nitride film is formed by using, for example, a chemical vapor deposition (CVD) method or an atomic layer deposition (ALD) method using a titanium tetrachloride ($TiCl_4$) and ammonia ($NH_3$) as a film forming gas (for example, a patent reference 1).

However, when a titanium nitride film is formed by using titanium tetrachloride as a film forming gas, chlorine radicals generated during film formation etch a base film. For example, when a titanium nitride film is formed as an upper electrode of a capacitor module of a dynamic random access memory (DRAM), a high-k film (for example, a zirconium oxide (ZrO) film or a hafnium oxide (HfO) film) constituting a base film of the upper electrode is etched, and thus an electric performance of a capacitor insulating film is deteriorated.

Also, since titanium tetrachloride is used as a film forming gas, ammonium chloride is generated as a by-product. When the ammonium chloride is adhered inside an apparatus, a process performance (particle performance) and a maintenance cycle of the apparatus are remarkably deteriorated.

3. Prior Art Reference (Patent Reference 1) Japanese Patent Laid-Open Publication No. 2006-93653

SUMMARY OF THE INVENTION

The present invention provides a method of forming a titanium nitride film, an apparatus for forming a titanium nitride film, and a program, which prevent a base film from being etched.

The present invention also provides a method of forming a titanium nitride film, an apparatus for forming a titanium nitride film, and a program, which prevents ammonium chloride from being generated as a by-product.

According to an aspect of the present invention, there is provided a method of forming a titanium nitride film, the method including forming a titanium nitride film on an object to be processed by heating an inside of a reaction chamber accommodating the object to a predetermined temperature, and then supplying a film forming gas including a titanium raw material into the reaction chamber, wherein, in the forming of the titanium nitride film, a raw material that does not include a chlorine atom and includes titanium, or a raw material that includes one chlorine atom and titanium is used as the titanium raw material.

According to another aspect of the present invention, there is provided an apparatus for forming a titanium nitride film, the apparatus including: a reaction chamber which accommodates an object to be processed; a heating unit which heats an inside of the reaction chamber to a predetermined temperature; a film forming gas supply unit which supplies a film forming gas including a titanium raw material into the reaction chamber; and a control unit which controls each element of the apparatus, wherein the control unit controls the heating unit to heat the inside of the reaction chamber accommodating the object to the predetermined temperature, and then controls the film forming gas supply unit to form the titanium nitride film on the object by supplying the film forming gas including the titanium raw material into the reaction chamber, and the titanium raw material is a raw material that does not include a chlorine atom and includes titanium, or a raw material that includes one chlorine atom and titanium.

According to another aspect of the present invention, there is provided a program which controls a computer for controlling an apparatus for forming a titanium nitride film, wherein the apparatus includes a reaction chamber accommodating an object to be processed and a function of supplying a film forming gas into the reaction chamber, wherein the program executes, in the computer, a sequence of heating an inside of the reaction chamber accommodating the object to a predetermined temperature, and then forming a titanium nitride film on the object by supplying the film forming gas including a titanium raw material that does not include a chlorine atom and includes titanium, or a raw material that includes one chlorine atom and titanium, into the reaction chamber.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
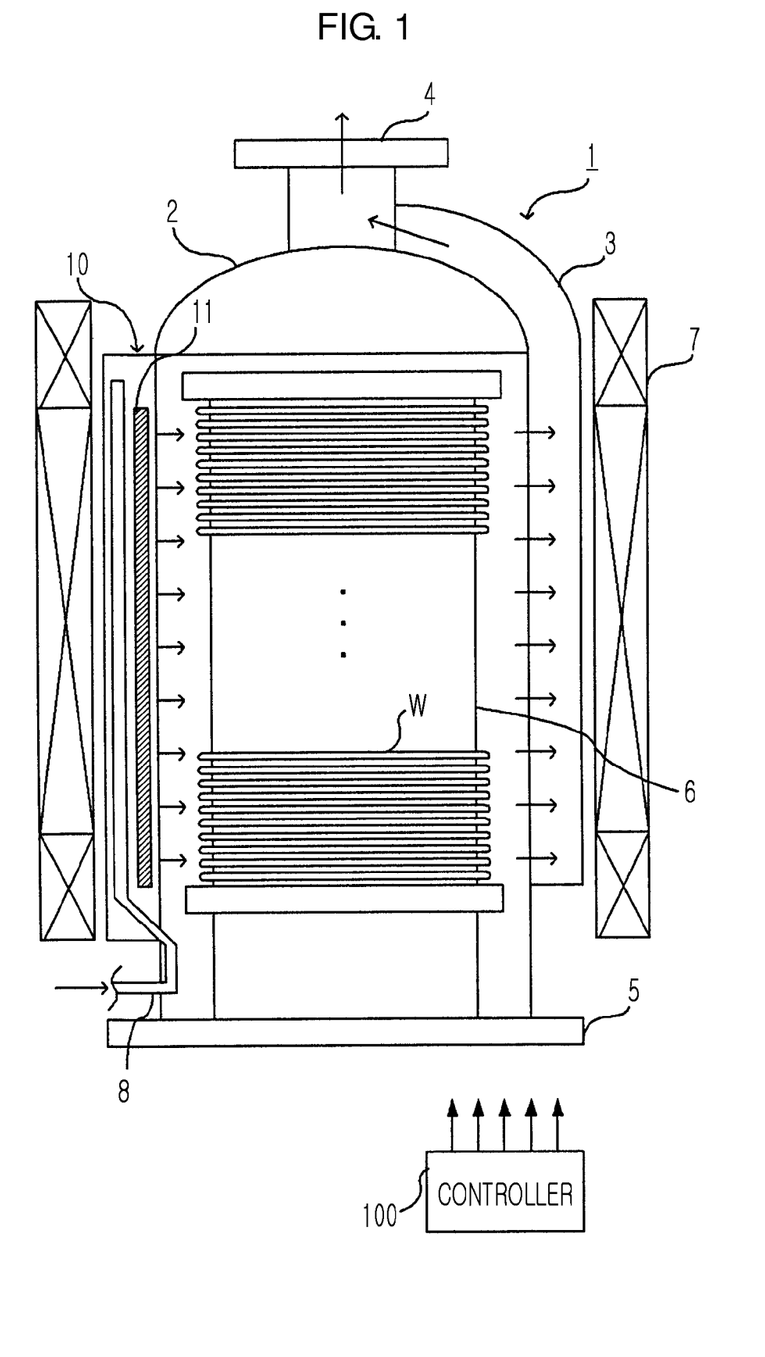
FIG. 1 is a view of a processing apparatus according to an embodiment of the present invention.
Figure 2:
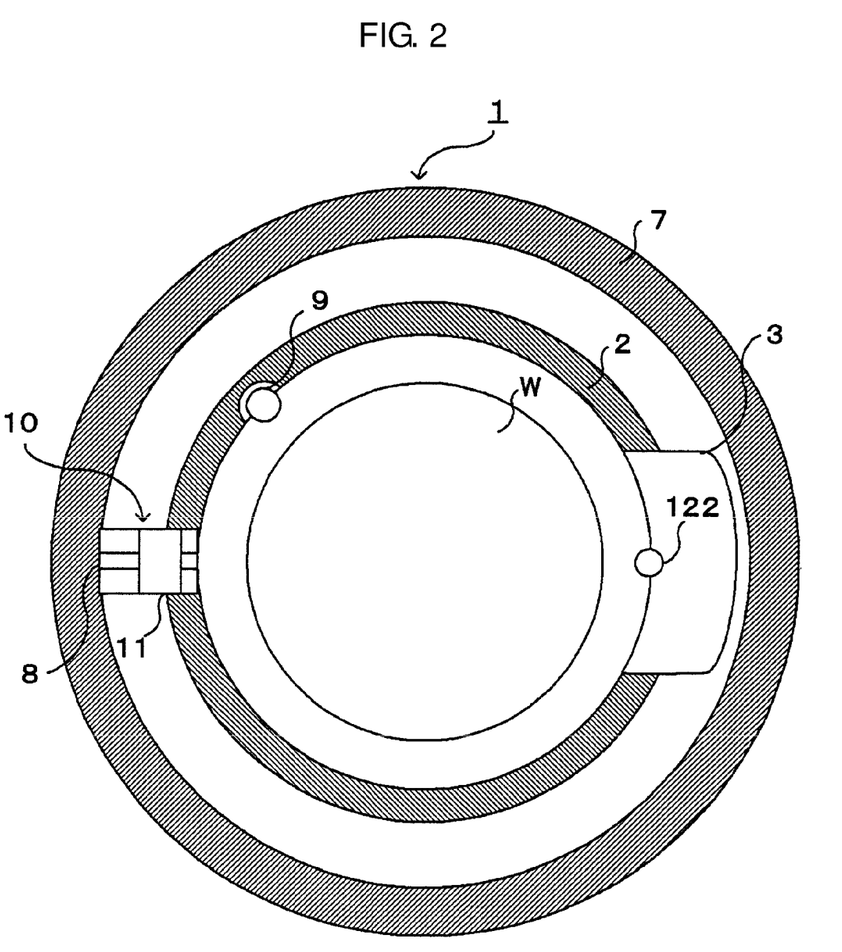
FIG. 2 is a view of a sectional structure of the processing apparatus of FIG. 1.

Hereinafter, a method of forming a titanium nitride film, an apparatus for forming a titanium nitride film, and a program, according to embodiments of the present invention are described. In the embodiments, a titanium nitride film is formed by using an atomic layer deposition (ALD) method. Also, in the embodiments, a batch-type vertical processing apparatus is described as an example of an apparatus for forming a titanium nitride film of the present invention. FIG. 1 is a view of a processing apparatus according to an embodiment of the present invention. Also, FIG. 2 is a view of a sectional structure of the processing apparatus of FIG. 1.

As shown in FIG. 1, the processing apparatus 1 includes a reaction pipe 2 that has an approximate cylindrical shape with a ceiling, wherein a longer direction is in a vertical direction. The reaction pipe 2 may be formed of a material having excellent heat-resistant and corrosion-resistant properties, for example, quartz.

An exhaust unit 3 for evacuating a gas inside the reaction pipe 2 is provided at one side of the reaction pipe 2. The exhaust unit 3 is provided to extend upward along the reaction pipe 2, and communicates with the reaction pipe 2 through an opening (not shown) provided on a side wall of the reaction pipe 2. An upper end of the exhaust unit 3 is connected to an exhaust port 4 provided on a top of the reaction pipe 2. An exhaust pipe (not shown) is connected to the exhaust port 4, and a pressure adjusting mechanism, such as a valve (not shown) or a vacuum pump 127 described below, is provided at the exhaust pipe. A gas inside the reaction pipe 2 is evacuated to the exhaust pipe through the opening, the exhaust unit 3, and the exhaust port 4 by using the pressure adjusting mechanism, and thus the inside of the reaction pipe 2 is controlled to desired pressure (vacuum level).

A lid 5 is provided at the bottom of the reaction pipe 2. The lid 5 may be formed of a material having excellent heat-resistant and corrosion-resistant properties, for example, quartz. The lid 5 is capable of moving up and down by a boat elevator 128 described below. Here, when the lid 5 moves up by the boat elevator 128, the lower (furnace opening) portion of the reaction pipe 2 is closed, and when the lid 5 moves down by the boat elevator 128, the lower (furnace opening) portion of the reaction pipe 2 is opened.

A wafer boat 6 is placed on the lid 5. The wafer boat 6 is formed of, for example, quartz. The wafer boat 6 is capable of accommodating a plurality of semiconductor wafers W at predetermined intervals in a vertical direction. Also, a heat reserving tank which prevents a temperature inside the reaction pipe 2 from decreasing from the furnace opening portion of the reaction pipe 2, or a rotating table on which the wafer boat 6 accommodating the semiconductor wafer W is rotatably placed may be provided on the top of the lid 5, and the wafer boat 6 may be placed on the heat reserving tank or the rotating table. In this case, it is easy to control the semiconductor wafer W accommodated in the wafer boat 6 to a uniform temperature.

A temperature adjusting mechanism, for example, a temperature increasing heater 7 constituted of a resistance heating element, may be provided to surround the reaction pipe 2, around the reaction pipe 2. The inside of the reaction pipe 2 is set to a predetermined temperature by the temperature increasing heater 7, and as a result, the semiconductor wafer W accommodated inside the reaction pipe 2 has a predetermined temperature.

Processing gas supply pipes 8 and 9 which supply a processing gas inside the reaction pipe 2 are inserted through a side surface near a bottom end of the reaction pipe 2. In the present embodiment, since a titanium nitride film is formed on the semiconductor wafer W, not only a titanium raw material and a nitriding gas as a film forming gas, but also a dilution gas or the like is used as a processing gas.

A titanium containing material is adsorbed on the semiconductor wafer W from the titanium raw material. A raw material that does not include a chlorine atom (Cl) and includes titanium, or a raw material that includes one chlorine atom and titanium is used as the titanium raw material, and in the present embodiment, methylcyclopentadienyl tris(dimethylamino)titanium (TIMCTA) is used. TIMCTA is solid at room temperature, but is liquefied at about 90° C. after being put in an ampoule. This gas (TIMCTA) is used as the titanium raw material because the gas has a relatively high steam pressure, can be supplied at a high flow rate, is specifically suitable for a processing apparatus of 100 to 150 substrates of 300 mm, has a high thermal decomposition temperature, and is stable. The titanium raw material is used during adsorbing described below.

A nitriding gas is a gas that nitrifies the adsorbed titanium containing material, and ammonia ($NH_3$) is used in the present embodiment as the nitriding gas. The nitriding gas is used during nitrifying described below. The dilution gas is a gas that dilutes the processing gas, and nitrogen ($N_2$) is used in the present embodiment as the dilution gas.

The nitriding gas from among the processing gases is supplied into the reaction pipe 2 through the processing gas supply pipe 8. The processing gas supply pipe 8 is inserted through a plasma generator 10 that will be described later. Thus, the nitriding gas supplied from the processing gas supply pipe 8 is plasma-excited (activated). The titanium raw material and the dilution gas are supplied into the reaction pipe 2 through the processing gas supply pipe 9. Also, a purge gas (for example, nitrogen ($N_2$)) is supplied into the reaction pipe 2 through the processing gas supply pipe 9. Alternatively, the purge gas may be supplied into the reaction pipe 2 through a separate purge gas supply pipe. As shown in FIG. 2, the processing gas supply pipe 9 is provided on an inner wall of the reaction pipe 2. Accordingly, the titanium raw material and the purge gas supplied from the processing gas supply pipe 9 are not plasma-excited (activated). A distributed injector, for example, is used as the processing gas supply pipe 9.

Supply holes are provided on each of the processing gas supply pipes 8 and 9 at predetermined intervals in a vertical direction, and the processing gas is supplied into the reaction pipe 2 from the supply holes. Thus, as shown by arrows in FIG. 1, the processing gas is supplied into the reaction pipe 2 from a plurality of locations in a vertical direction. Also, each of the processing gas supply pipes 8 and 9 is connected to a processing gas supply source (not shown) through a mass flow controller (MFC) 125 described below. Here, FIG. 1 only shows the processing gas supply pipe 8 supplying a processing gas that is plasma-processed described below (in the present embodiment, a processing gas supply pipe supplying a nitriding gas). Also, FIG. 2 shows the processing gas supply pipe 8 supplying the nitriding gas, and the processing gas supply pipe 9 supplying a processing gas that is not plasma-processed described below (in the present embodiment, a processing gas supply pipe supplying a source gas or a purge gas).

The plasma generator 10 is provided on another side of the reaction pipe 2, i.e., on a side opposite to the side of the reaction pipe 2 where the exhaust unit 3 is provided. The plasma generator 10 includes a pair of electrodes 11. The processing gas supply pipe 8 is inserted through between the pair of electrodes 11. The pair of electrodes 11 are connected to a high frequency power source, a matching unit, etc., which are not shown. Also, by applying high frequency power between the pair of electrodes 11 from the high frequency power source through the matching unit, the processing gas supplied between the pair of electrodes 11 is plasma-excited (activated), and, for example, an ammonia radical (NH$_3$*) is generated. The ammonia radical or the like generated as such is supplied into the reaction pipe 2 from the plasma generator 10.

Also, a plurality of temperature sensors 122 constituted of, for example a thermocouple, and measuring a temperature inside the reaction pipe 2, and a plurality of pressure gauges 123 measuring a pressure inside the reaction pipe 2 are provided inside the reaction pipe 2.

Figure 3:
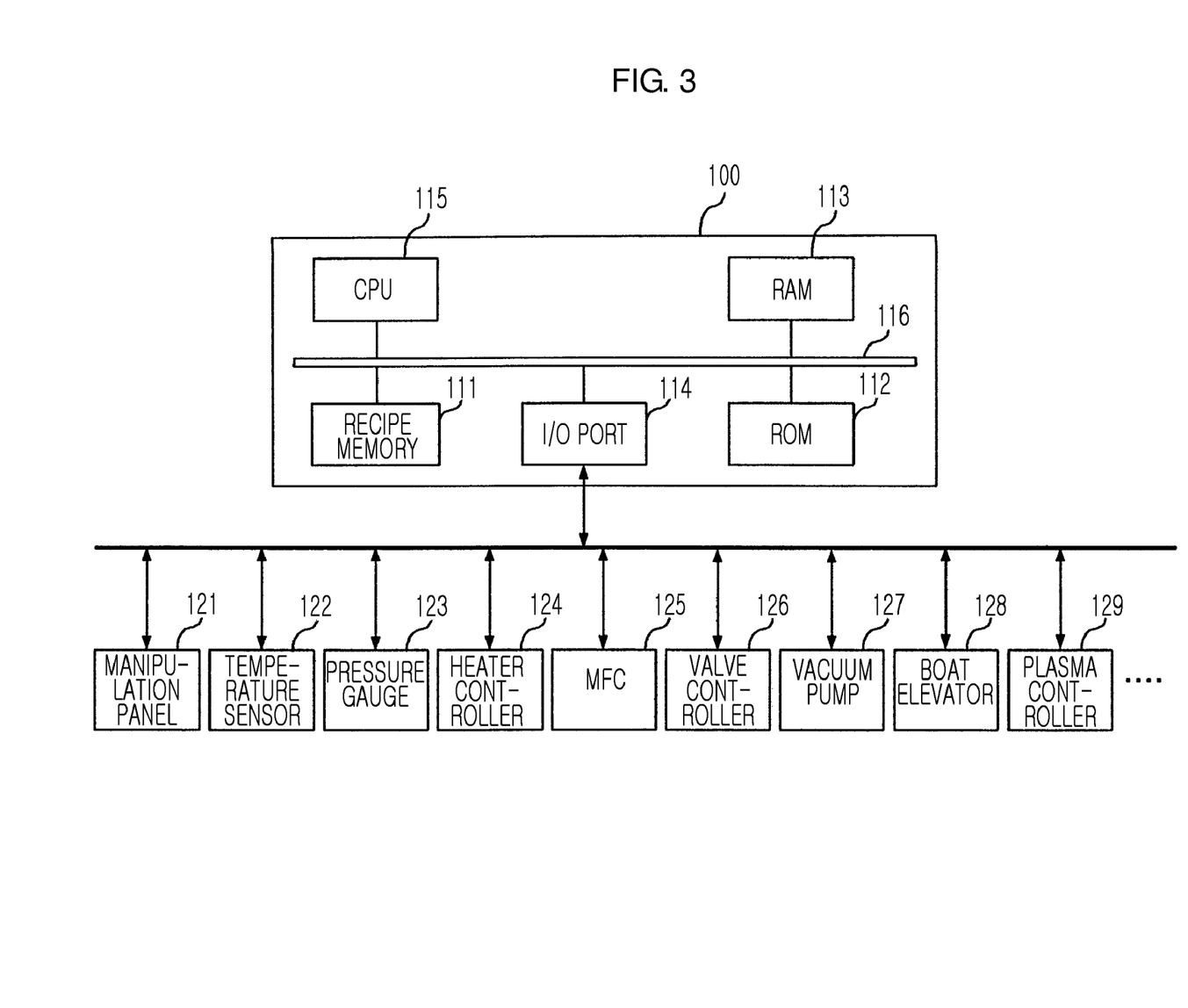
FIG. 3 is a diagram showing a configuration of a controller of FIG. 1.

Also, the processing apparatus 1 includes a controller 100 for controlling each element of the processing apparatus 1. FIG. 3 shows a structure of the controller 100. As shown in FIG. 3, a manipulation panel 121, the temperature sensor 122, the pressure gauge 123, a heater controller 124, the MFC 125, a valve controller 126, the vacuum pump 127, the boat elevator 128, a plasma controller 129, etc. are connected to the controller 100.

The manipulation panel 121 includes a display screen and a manipulation button to transmit a manipulation command of an operator to the controller 100, and display various pieces of information from the controller 100 on the display screen.

The temperature sensor 122 measures a temperature of each element in the reaction pipe 2, the exhaust pipe, etc., and notifies the measured temperature to the controller 100.

The pressure gauge 123 measures a pressure of each element in the reaction pipe 2, the exhaust pipe, etc., and notifies the measured pressure to the controller 100.

The heater controller 124 separately controls the temperature increasing heaters 7. The heater controller 124 responds to a command from the controller 100, heats the temperature increasing heaters 7 by supplying an electric current to the temperature increasing heaters 7, and separately measures power consumption of the temperature increasing heaters 7 to notify the measured power consumption to the controller 100.

The MFC 125 is provided at each pipe of the processing gas supply pipes 8 and 9, etc., and measures and notifies an actual flow rate of gas flowing through each pipe to the controller 100 while controlling a flow rate of a gas flowing through each pipe to an amount directed by controller 100.

The valve controller 126 is provided at each pipe, and controls an opening degree of a valve provided at each pipe to a value directed by the controller 100.

The vacuum pump 127 is connected to the exhaust pipe to evacuate a gas inside the reaction pipe 2.

The lid 5 is moved up by the boat elevator 128 to load the wafer boat 6 (semiconductor wafer W) into the reaction pipe 2, and moved down by the boat elevator 128 to unload the wafer boat 6 (semiconductor wafer W) from the reaction pipe 2.

The plasma controller 129 controls the plasma generator 10. The plasma controller 129 controls the plasma generator 10 by responding to a command from the controller 100, and generates an ammonia radical (NH$_3$*) or the like by activating, for example, ammonia supplied into the plasma generator 10.

The controller 100 includes a recipe memory 111, a read-only memory (ROM) 112, a random access memory (RAM) 113, an input/output (I/O) port 114, a central processing unit (CPU) 115, and a bus 116 connecting thereof.

The recipe memory 111 stores a setup recipe and a plurality of process recipes. Only the setup recipe is stored while initially manufacturing the processing apparatus 1. The setup recipe is executed when a thermal model or the like according to each processing apparatus is generated. The process recipe is a recipe prepared for each thermal treatment (process) actually executed by a user, and defines a temperature change of each element, a pressure change inside the reaction pipe 2, timing of starting and stopping supply of a processing gas, a supply amount of the processing gas, etc. from loading of the semiconductor wafer W into the reaction pipe 2 to unloading of the semiconductor wafer W which has been completely processed.

The ROM 122 includes an electrically erasable and programmable read only memory (EEPROM), a flash memory, a hard disk, or the like, and is a recording medium having stored thereon an operation program or the like of the CPU 115.

The RAM 113 operates as a work area of the CPU 115.

The I/O port 114 is connected to the manipulation panel 121, the temperature sensor 122, the pressure gauge 123, the heater controller 124, the MCF 125, the valve controller 126, the vacuum pump 127, the boat elevator 128, the plasma controller 129, etc., and controls input and output of data or a signal.

The CPU 115 performs a pivot role of the controller 100, and executes a control program stored in the ROM 112. The CPU 115 controls an operation of the processing apparatus 1 according to a recipe (process recipe) stored in the recipe memory 111 by a command from the manipulation panel 121. In other words, the CPU 115 enables the temperature sensor 122, the pressure gauge 123, the MFC 125, etc. to measure a temperature, a pressure, a flow rate, etc. of each element in the reaction pipe 2, the exhaust pipe, etc., and outputs a control signal or the like to the heater controller 124, the MFC 125, the valve controller 126, the vacuum pump 127, etc. based on the measured data, such that the each element follows the process recipe.

The bus 116 transmits information between each element.

Next, a method of forming a titanium nitride film by using the processing apparatus 1 configured as above is described with reference to a recipe (time sequence) shown in FIG. 4.

Figure 4:
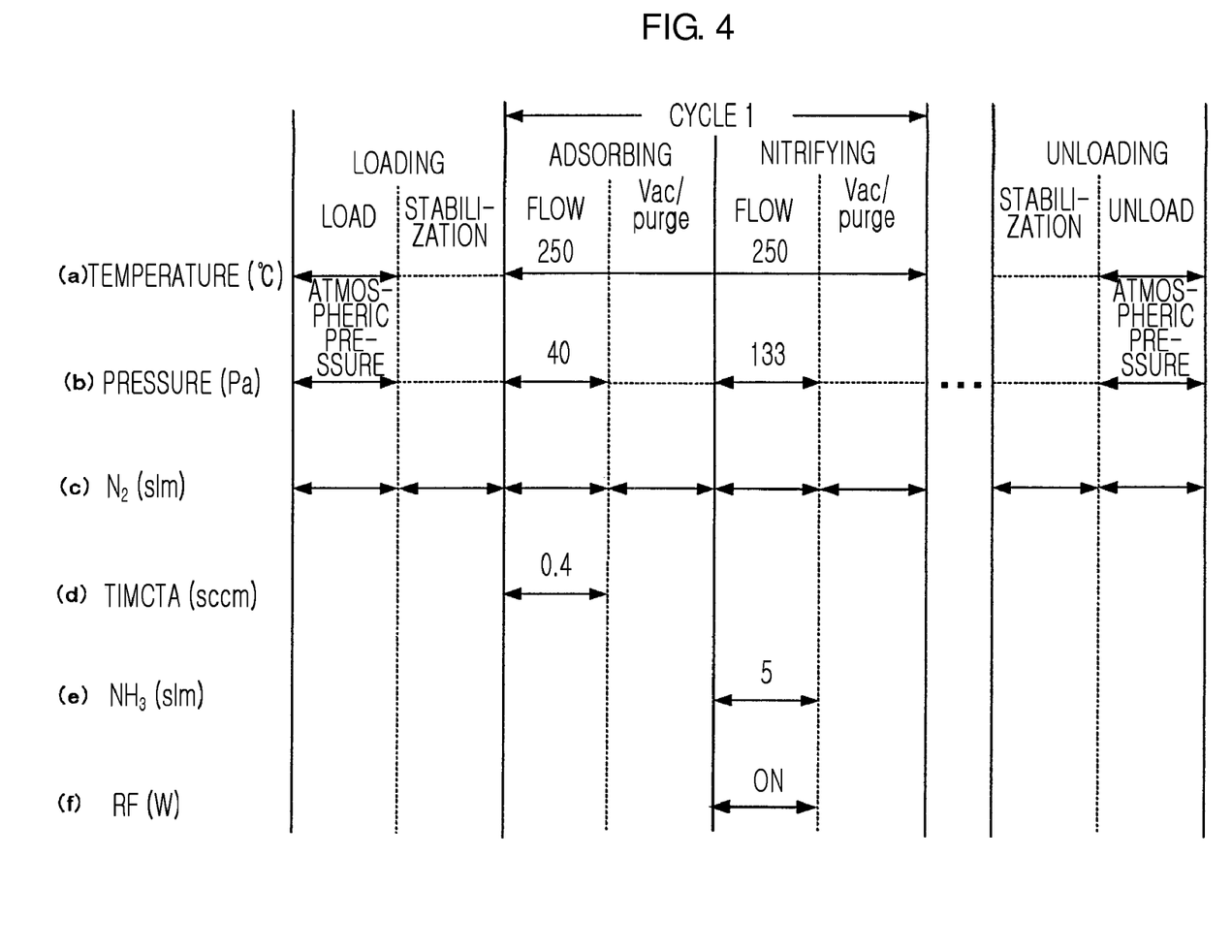
FIG. 4 is a diagram for describing an example of a method of forming a titanium nitride film.

In the present embodiment, as shown in FIG. 4, the method includes adsorbing of a titanium containing material (hereinafter, referred to as "titanium" or "Ti") including titanium (Ti) to the surface of the semiconductor wafer W, and nitrifying of the adsorbed Ti, wherein the adsorbing and nitrifying indicate one cycle of an ALD method. Also, as shown in FIG. 4, in the present embodiment, TIMCTA is used as a titanium raw material, ammonia (NH$_3$) is used as a nitriding gas, and nitrogen (N$_2$) is used as a dilution gas. The cycle shown in the recipe of FIG. 4 is performed (repeated) a plurality of times, for example 100 times, thereby forming a desired titanium nitride film on the semiconductor wafer W.

Also, in the following description, an operation of each element constituting the processing apparatus 1 is controlled by the controller 100 (CPU 115). Also, as described above, the temperature, the pressure, the flow rate of the gas, etc. inside the reaction pipe 2 during each process are set to the condition according to the recipe shown in FIG. 4 as the controller 100 (CPU 115) controls the heater controller 124 (the temperature increasing heater 7), the MFC 125 (the processing gas supply pipes 8 and 9), the valve controller 126, the vacuum pump 127, the plasma controller 129 (the plasma generator 10), etc.

First, the semiconductor wafer W constituting an object to be processed is accommodated (loaded) in the reaction pipe 2. In detail, the inside of the reaction pipe 2 is maintained at a predetermined load temperature by the temperature increasing heater 7, and a predetermined amount of nitrogen is supplied into the reaction pipe 2. Also, the wafer boat 6 accommodating the semiconductor wafer W is placed on the lid 5. Then, the lid 5 is moved up by the boat elevator 128 to load the semiconductor wafer W (wafer boat 6) into the reaction pipe 2 (a loading process).

Next, an inside of the reaction pipe 2 is set to a predetermined temperature, for example, as shown in FIG. 4(a), 250° C., by the temperature increasing heater 7. Also, a predetermined amount of nitrogen is supplied into the reaction pipe 2 from the processing gas supply pipe 9 while exhausting a gas inside the reaction pipe 2, thereby setting the inside of the reaction pipe 2 to a predetermined pressure, for example, as shown in FIG. 4(b), 40 Pa (0.3 Torr). Then, the inside of the reaction pipe 2 is stabilized to maintain this temperature and pressure (a stabilizing process).

When the inside of the reaction pipe 2 is stabilized to maintain this temperature and pressure, the Ti is adsorbed on the surface of the semiconductor wafer W. The adsorbing is a process of supplying a titanium raw material to the semiconductor wafer W, and adsorbing the Ti on the surface thereof. In the present embodiment, TIMCTA is supplied to the semiconductor wafer W to adsorb the Ti on the semiconductor wafer W.

In the adsorbing, first, a predetermined amount of TIMCTA, for example, 0.4 sccm as shown in FIG. 4(d), and a predetermined amount of nitrogen as shown in FIG. 4(c) are supplied into the reaction pipe 2 from the processing gas supply pipe 9 (a flow process).

Here, the temperature inside the reaction pipe 2 may be from 200° C. to 350° C. If the temperature inside the reaction pipe 2 is lower than 200° C., TIMCTA may not be sufficiently heated (activated), and it may be difficult to adsorb the Ti on the surface of the semiconductor wafer W. Also, if the temperature inside the reaction pipe 2 is higher than 350° C., a film quality, film thickness uniformity, or the like of a formed titanium nitride film may deteriorate. However, since a film forming speed of a titanium nitride film is increased when the temperature inside the reaction pipe 2 is higher than 350° C., the temperature inside the reaction pipe 2 may be higher than 350° C. if it is important to improve productivity of a titanium nitride film.

Also, in the method of forming a titanium nitride film, the temperature inside the reaction pipe 2 may not be changed regarding a film forming sequence. Thus, in the present embodiment, as described below, the temperature inside the reaction pipe 2 is not changed and set to 250° C. even during the nitrifying.

A supply amount of TIMCTA may be from 0.01 sccm to 1 sccm. If the supply amount is less than 0.01 sccm, TIMCTA may not be sufficiently supplied to the surface of the semiconductor wafer W, and if the supply amount is more than 1 sccm, there may be a large amount of TIMCTA that does not contribute to a reaction. The supply amount of TIMCTA may be preferably from 0.05 sccm to 0.8 sccm. As such, a reaction between the surface of the semiconductor wafer W and TIMCTA may be further accelerated.

The pressure inside the reaction pipe 2 may be from 13.3 Pa (0.1 Torr) to 13.3 kPa (100 Torr). As such, the reaction between the surface of the semiconductor wafer W and TIMCTA may be further accelerated.

When TIMCTA is supplied into the reaction pipe 2, the supplied TIMCTA is heated (activated) and reacts with the surface of the semiconductor wafer W, and thus the Ti is adsorbed on the surface of the semiconductor wafer W.

Here, since TIMCTA constituting a raw material that does not include a chorine atom and includes titanium is used as the titanium raw material, a chlorine radical is not generated as in a conventional process using $TiCl_4$. Thus, a base film of the titanium nitride film is not etched while forming the titanium nitride film. Also, a by-product, such as ammonium chloride, is not generated different from the conventional process using $TiCl_4$.

When a predetermined amount of the Ti is adsorbed on the surface of the semiconductor wafer W, supplying of TIMCTA and nitrogen from the processing gas supply pipe 9 is stopped. Then, the gas inside the reaction pipe 2 is exhausted while, for example, supplying a predetermined amount of nitrogen from the processing gas supply pipe 9 into the reaction pipe 2, thereby exhausting the gas inside the reaction pipe 2 to the outside of the reaction pipe 2 (a Vac/purge process).

Next, the surface of the semiconductor wafer W is nitrified. The nitrifying is a process of nitrifying the adsorbed Ti by supplying the nitriding gas to the semiconductor wafer W on which the Ti is adsorbed. In the present embodiment, the adsorbed Ti is nitrified by supplying ammonia (ammonia radicals) to the semiconductor wafer W.

In the nitrifying, the inside of the reaction pipe 2 is set to a predetermined temperature, for example, as shown in FIG. 4(a), 250° C., by the temperature increasing heater 7. Also, a predetermined amount of nitrogen is supplied into the reaction pipe 2 from the processing gas supply pipe 9, while exhausting a gas inside the reaction pipe 2, thereby setting the inside of the reaction pipe 2 to a predetermined pressure, for example, as shown in FIG. 4(b), 133 Pa (1 Torr). Then, as shown in FIG. 4(f), high frequency power is applied (ON) between the electrodes 11 from the high frequency power source (not shown) through the matching unit (not shown). Also, a predetermined amount of ammonia, for example, as shown in FIG. 4(e), 5 slm, is supplied between the pair of electrodes 11 (inside the plasma generator 10) from the processing gas supply pipe 8. The ammonia supplied between the pair of electrodes 11 is plasma-excited (activated), and generates ammonia radicals ($NH_3^*$). The ammonia radicals generated as such are supplied into the reaction pipe 2 from the plasma generator 10. Also, as shown in FIG. 4(c), a predetermined amount of nitrogen as the dilution gas is supplied into the reaction pipe 2 from the processing gas supply pipe 9 (a flow process).

Here, a supply amount of the ammonia may be from 0.01 slm to 20 slm. Within a range described above, plasma is generated without any problem, and at the same time, the ammonia radicals enough to form the titanium nitride film may be supplied. The supply amount of the ammonia may be preferably from 1 slm to 10 slm. Within a range described above, plasma may be stably generated.

The pressure inside the reaction pipe 2 may be from 13.3 Pa (0.1 Torr) to 13.3 kPa (100 Torr). Within a range described above, the ammonia radicals are easily generated, and a mean free path of the ammonia radicals is increased in a space where the semiconductor wafer W is placed. The pressure inside the reaction pipe 2 may be preferably from 40 Pa (0.3 Torr) to 1330 Pa (10 Torr). Within a range described above, it is easy to control the pressure inside the reaction pipe 2.

When the ammonia radicals are supplied into the reaction pipe 2, the Ti adsorbed on the semiconductor wafer W is nitrified, and thus the titanium nitride film is formed on the semiconductor wafer W.

When the desired titanium nitride film is formed on the semiconductor wafer W, the supplying of the ammonia from the processing gas supply pipe 8 is stopped, and the applying of the high frequency power from the high frequency power source (not shown) is stopped. Also, the supplying of nitrogen from the processing gas supply pipe 9 is stopped. Also, while exhausting a gas inside the reaction pipe 2, a predetermined amount of nitrogen is supplied into the reaction pipe 2 from the processing gas supply pipe 9 as shown in FIG. 4(c), thereby exhausting a gas inside the reaction pipe 2 to the outside of the reaction pipe 2 (a Vac/purge process).

Accordingly, one cycle of the ALD method including the adsorbing and the nitrifying is finished.

Next, the one cycle of the ALD method starting from the adsorbing is again started. Then, the cycle is repeated a predetermined number of times. Accordingly, TIMCTA is supplied to the surface of the semiconductor wafer W, and thus the Ti is adsorbed on the surface of the semiconductor wafer W. The adsorbed Ti is nitrified, thereby additionally forming the titanium nitride film. As a result, the titanium nitride film having a desired thickness is formed on the semiconductor wafer W.

When the titanium nitride film having a desired thickness is formed on the semiconductor wafer W, the semiconductor wafer W is unloaded. In detail, a predetermined amount of nitrogen is supplied into the reaction pipe 2 from the processing gas supply pipe 9, and the pressure inside the reaction pipe 2 is returned to an atmospheric pressure while maintaining the inside of the reaction pipe 2 to a predetermined unload temperature by the temperature increasing heater 7 (stabilizing process). Then, the lid 5 is moved down by the boat elevator 128 to unload the semiconductor wafer W (an unloading process). Accordingly, the method of forming a titanium nitride film is ended.

A film forming speed (deposition rate) per one cycle was measured to the titanium nitride film formed according to the method. Also, for comparison, a film forming speed per one cycle of a titanium nitride film formed by using an ALD method while using $TiCl_4$ and $NH_3$ as a conventional film forming gas was measured in the same manner. Also, a film forming temperature in the conventional method was 450° C. The film forming speed per one cycle of the titanium nitride film formed according to the method of the present embodiment was 0.10 nm/cycle, and the film forming speed per one cycle of the titanium nitride film formed by the conventional method was 0.04 nm/cycle. As such, the method of the present embodiment had a lower temperature (250° C.) than the conventional method, and is a method of forming a titanium nitride film having an improved film forming speed.

As described above, according to the present embodiment, since TIMCTA constituting a raw material that does not include a chlorine atom and includes titanium is used as a titanium raw material, a chlorine radical is not generated different from a conventional case of using $TiCl_4$. Accordingly, a base film of the titanium nitride film is not etched while forming the titanium nitride film. Further, a by-product, such as ammonium chloride, is not generated different from the conventional case of using $TiCl_4$. Also, productivity of the titanium nitride film may be improved at a low temperature.

The present invention is not limited to the embodiments described above, and may vary and applied. Hereinafter, other embodiments applicable to the present invention are described.

In the above embodiments, a case of using TIMCTA that does not include a chlorine atom and includes titanium as a titanium raw material is described as an example, but alternatively, a raw material including one chlorine atom and titanium may be used as a titanium raw material, and for example, chloro tris(N-ethylmethylamino)titanium (TiCl(NEtMe)$_3$) may be used. In this case, a chlorine radical is not generated different from the conventional case of using $TiCl_4$, and the base film of the titanium nitride film is not etched while forming the titanium nitride film. Also, a by-product, such as ammonium chloride, is not generated different from the conventional case of using $TiCl_4$. Further, productivity of the titanium nitride film may be improved at a low temperature.

In addition, when the raw material including one chlorine atom and titanium, such as chloro tris(N-ethylmethylamino) titanium is used, adsorption onto the base film (oxide film) is easy, and thus the raw material may be reacted at a relatively low temperature. Meanwhile, when a gas including a lot of Cl is used like the conventional case of using $TiCl_4$, a process has to be performed at a high temperature, and thus the base film is largely etched. Accordingly, comparing a number of particles after film formation, about 100 particles (equal to or above 0.2 μm) are generated when conventional $TiCl_4$ is used, but a number of generated particles may be suppressed to an average of 10 when the raw material including one chlorine atom and titanium is used.

Also, in the above embodiments, the present invention is described with an example of TIMCTA as the titanium raw material that does not include a chlorine atom (Cl) and includes titanium, but alternatively, for example, ethylcyclopentadienyl tris(dimethylamino)titanium, cyclopentadienyl tris(dimethylamino)titanium or the like may be used.

In the above embodiments, the present invention is described with an example of performing the nitrifying after performing the adsorbing in one cycle of the ALD method, but the adsorbing may be performed after performing the nitrifying. In this case as well, the base film of the titanium nitride film is not etched while forming the titanium nitride film, and a by-product, such as ammonium chloride, is not generated.

In the above embodiments, the present invention is described with an example of forming the titanium nitride film on the semiconductor wafer W by performing 100 cycles, but a number of cycles may be reduced, for example, to 50 cycles. Alternatively, the number of cycles may be increased, such as 200 cycles. In this case as well, a titanium nitride film having a desired thickness may be formed according to the number of cycles, for example, by adjusting supply amounts of TIMCTA and ammonia, or the like.

Also, while performing the plurality of cycles, the cycles may include a first process of performing initial cycles from a first cycle to a predetermined number of times, and a second process of performing subsequent cycles. For example, the temperature inside the reaction pipe 2 may be from 200° C. to 350° C. in the first process, and may be 350° C. or above in the second process. In detail, when 100 cycles are performed, the temperature inside the reaction pipe 2 may be from 200° C. to 350° C. from first to twenty cycles, and may be 350° C. or above from twenty one to hundred cycles. In this case, the film forming speed of the titanium nitride film is improved, thereby improving productivity of the titanium nitride film.

Also, the temperature inside the reaction pipe 2 may vary according to a thickness of the formed titanium nitride film. For example, cycles performed until the thickness of the titanium nitride film is 1 nm may be a first process and subsequent cycles may be a second process. The temperature inside the reaction pipe 2 may be 200° C. to 350° C. in the first process, and is 350° C. or above in the second process. In this case as well, the film forming speed of the titanium nitride film is improved, thereby improving productivity of the titanium nitride film.

Also, the titanium nitride film may have a double layer structure, and the titanium nitride film may be formed on only a side of the base film (oxide film) by using the method of the present invention. For example, TIMCTA and ammonia of the present embodiment may be used as a film forming gas in the first process, and a raw material (Ti source including Cl) including a chlorine atom and titanium, and ammonia, for example $TiCl_4$ and ammonia, may be used as a film forming gas in the second process, thereby forming a titanium nitride film. As such, by forming at least the titanium nitride film on the side of the base film by using the method of the present embodiment, the base film of the titanium nitride film is not etched while forming the titanium nitride film, and at the same time, it is difficult to form a by-product, such as ammonium chloride.

In the above embodiments, the present invention is described with an example of using ammonia as the nitriding gas, but the nitriding gas is not limited as long as the Ti adsorbed on the semiconductor wafer W is nitrified, and for example, may be nitrous oxide ($N_2O$), nitrogen monoxide (NO), nitrogen ($N_2$), or the like.

In the above embodiments, the present invention is described with an example of forming a titanium nitride film by using the ALD method, but for example, a titanium nitride film may be formed by using, for example, a chemical vapor deposition (CVD) method.

In the above embodiments, the present invention is described with an example of activating ammonia (nitriding gas) by using the plasma generator 10, but the nitriding gas may not be activated by using plasma. Also, in the above embodiments, the present invention is described with an example of generating an ammonia radical by using plasma, but the present invention is not limited as long as the nitriding gas is activated, for example, by using a catalyst, ultraviolet rays (UV), heat, magnetic force, or the like. Also, the nitriding gas may be activated (turn into an ammonia radical) inside the processing apparatus 1, or may be activated outside the processing apparatus 1 and supplied into the processing apparatus 1 (reaction pipe 2).

In the above embodiments, the present invention is described with an example of setting the same temperature inside the reaction pipe 2 during the adsorbing and the nitrifying, but for example, the temperature inside the reaction pipe 2 during the adsorbing and the temperature inside the reaction pipe 2 during the nitrifying may be different from each other, such that the temperature inside the reaction pipe 2 during the adsorbing is 200° C. and the temperature inside the reaction pipe 2 during the nitrifying is 300° C.

In the above embodiments, the present invention is described with an example of performing the Vac/purge process after the flow processes of the adsorbing and the nitrifying, but for example, a vacuum process of exhausting a gas inside the reaction pipe 2 may be performed without purging.

In the above embodiments, the present invention is described with an example of supplying nitrogen as the dilution gas while supplying the processing gas, but nitrogen may not be supplied while supplying the processing gas. However, it is preferable to include the dilution gas since it is easy to set a process time or the like by including nitrogen as the dilution gas. The dilution gas may be an inert gas, and for example, helium (He), neon (Ne), argon (Ar), krypton (Kr), or xenon (Xe) may be applied aside from nitrogen.

In the above embodiments, the present invention is described with an example of providing the processing gas supply pipe 8 for supplying the processing gas that is plasma-processed, and the processing gas supply pipe 9 for supplying the processing gas that is not plasma-processed, but for example, a processing gas supply pipe may be provided for each type of processing gas. Alternatively, the plurality of processing gas supply pipes 8 and 9 may be inserted through the side near the bottom of the reaction pipe 2 so that the same gas is supplied from a plurality of processing gas supply pipes. In this case, the processing gas is supplied into the reaction pipe 2 from the plurality of processing gas supply pipes 8 and 9, and thus the processing gas may be uniformly supplied into the reaction pipe 2.

In the present embodiment, the present invention is described with an example of a batch type processing apparatus having a single pipe structure as the processing apparatus 1, but for example, the present invention may be applied to a batch type vertical processing apparatus having a double pipe structure, where the reaction pipe 2 includes an inner pipe and an outer pipe. Alternatively, the present invention may be applied to a batch type horizontal processing apparatus or a single wafer type processing apparatus.

The controller 100 according to the embodiment of the present invention may be realized by using a general computer system, instead of an exclusive system. For example, a program for executing the above processes may be installed by a general-use computer from a recording medium (a flexible disk, a CD-ROM, or the like) storing the program, thereby configuring the controller 100 performing the above processes.

Also, a unit for supplying the program is arbitrary. Besides supplying the program by using a predetermined recording medium as described above, the program may be supplied through, for example, a communication line, a communication network, or a communication system. In this case for example, the program may be put up on a bulletin board system (BBS) of a communication network, and supplied along with a carrier wave through the network. Also, the program supplied as such may be activated, and equally executed like other application programs under control of an operating system (OS), thereby performing the above described processes.

The present invention is advantages in forming of a titanium nitride film.

According to the present invention, etching of a base film may be prevented while forming a titanium nitride film. Also, ammonium chloride is prevented from being generated as a by-product while forming a titanium nitride film.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of forming a titanium nitride film, the method comprising:
    adsorbing a titanium containing material on an object to be processed by supplying a titanium raw material comprising a raw material that does not include a chlorine atom and includes titanium, or a raw material that includes one chlorine atom and titanium into a reaction chamber accommodating the object; and
    nitrifying the titanium containing material adsorbed on the object by using a nitriding gas, the nitriding gas being activated.

2. The method of claim 1, wherein, in the forming of the titanium nitride film, methylcyclopentadienyl tris(dimethylamino)titanium, ethylcyclopentadienyl tris(dimethylamino)titanium, cyclopentadienyl tris(dimethylamino)titanium, or chloro tris(N-ethylmethylamino)titanium is used as the titanium raw material.

3. The method of claim 1,
    wherein a cycle comprising the adsorbing and the nitrifying is repeatedly performed a plurality of times.

4. The method of claim 3, wherein the forming of the titanium nitride film comprises a first process of performing initial cycles from the first cycle to a predetermined number of times, and a second process of performing subsequent cycles, wherein methylcyclopentadienyl tris(dimethylamino)

titanium as the titanium raw material and ammonia as the nitriding gas are used in the first process, and a raw material including a chlorine atom and titanium as the titanium raw material and ammonia as the nitriding gas are used in the second process.

5. The method of claim 4, wherein, in the first process and/or the second process, the ammonia is activated by using plasma.

6. The method of claim 4, wherein, in the first process, a temperature inside the reaction chamber is set from 200° C. to 350° C., and in the second process, the temperature inside the reaction chamber is set to 350° C. or above.

7. The method of claim 1, wherein, in the forming of the titanium nitride film, a temperature inside the reaction chamber is set from 200° C. to 350° C.

* * * * *